(12) United States Patent
Bischof et al.

(10) Patent No.: US 8,304,845 B2
(45) Date of Patent: Nov. 6, 2012

(54) METHOD FOR SEALING AN OPENING

(75) Inventors: Udo Bischof, Wannweil (DE); Holger Hoefer, Sonnenbuehl (DE); Volker Schmitz, Pfullingen (DE); Axel Grosse, Pfullingen (DE); Lutz Mueller, Aichtal (DE); Ralf Hausner, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 1021 days.

(21) Appl. No.: 12/086,893

(22) PCT Filed: Nov. 24, 2006

(86) PCT No.: PCT/EP2006/068869
§ 371 (c)(1),
(2), (4) Date: Nov. 20, 2008

(87) PCT Pub. No.: WO2007/071523
PCT Pub. Date: Jun. 28, 2007

(65) Prior Publication Data
US 2009/0174148 A1  Jul. 9, 2009

(30) Foreign Application Priority Data
Dec. 20, 2005  (DE) .................. 10 2005 060 870

(51) Int. Cl.
*H01L 29/84* (2006.01)

(52) U.S. Cl. ........ 257/415; 257/522; 257/682; 257/690; 257/698; 257/710; 438/422; 438/425; 438/456; 438/624; 438/676

(58) Field of Classification Search .................. None
See application file for complete search history.

(56) References Cited

U.S. PATENT DOCUMENTS

| | | | |
|---|---|---|---|
| 4,447,757 A * | 5/1984 | Kawaguchi et al. | 313/509 |
| 2004/0126953 A1* | 7/2004 | Cheung | 438/200 |
| 2004/0224091 A1* | 11/2004 | Rusu et al. | 427/255.28 |
| 2005/0184382 A1 | 8/2005 | Chen et al. | |
| 2006/0144142 A1* | 7/2006 | Gogoi | 73/504.02 |

FOREIGN PATENT DOCUMENTS

| | | |
|---|---|---|
| EP | 1 274 648 | 1/2003 |
| EP | 1 460 038 | 9/2004 |
| JP | 2004-314292 | 11/2004 |
| WO | 02/073691 | 9/2002 |
| WO | WO 03/057618 | 7/2003 |

\* cited by examiner

*Primary Examiner* — Kyoung Lee
(74) *Attorney, Agent, or Firm* — Kenyon & Kenyon LLP

(57) ABSTRACT

An integrated component having a substrate, the substrate having a cavity which surrounds a mechanical structure. The cavity is filled by a fluid of a specific composition under a specific pressure, and the mechanical properties of the mechanical structure are influenced by the fluid.

16 Claims, 5 Drawing Sheets

METHOD FOR SEALING AN OPENING

FIELD OF THE INVENTION

The present invention relates to a method for sealing an opening in a substrate. The invention also relates to an integrated component having a substrate.

BACKGROUND INFORMATION

Besides the integration of electronic circuits, technological advancement has also led to miniaturization of mechanical components and systems. What are referred to as microelectromechanical systems (MEMS) realize mechanical units in the range of a few micrometers and less. In so doing, industrial production makes use of a multilayer construction, often falling back on materials from the semiconductor industry. In this context, cavities are formed in which micromechanical structures may be disposed. Moreover, as a rule, upper layers are provided which enclose the mechanical structure in the cavity in which a well-defined environment may be created. For this, a suitable liquid or gaseous fluid is introduced into the cavity through openings, and the openings are sealed. With that, the cavity is also protected from external influences, and an unwanted change over time such as corrosion is prevented. Therefore, there is a requirement to seal the openings, and accordingly, to permanently enclose a fluid in the cavity.

Known methods enclose a fluid whose pressure and density are often unable to substantially influence the mechanical properties of the mechanical structure.

Moreover, in conventional methods, sealing material and sometimes also aggressive components penetrate into the cavity, where they can then lead to damage. For example, to seal off a mechanical structure in a cavity, EP 1274648 B1 discusses the closure of openings by a "refill process." In that case, remaining openings in the substrate are plugged, and an internal pressure or an internal atmosphere, which are determined by the process conditions of the refill process, is trapped in the cavity. The containment of a specific internal atmosphere decoupled from this process is not possible. Furthermore, sealing material, components thereof or perhaps reaction products are able to penetrate into the cavity.

SUMMARY OF THE INVENTION

Therefore, an object of the present invention is to provide an improved method for sealing an opening in a substrate. It is further an object of the present invention to provide an improved integrated component having a mechanical structure. This objective is achieved by the method as set forth herein and the integrated component as set forth herein. Further advantageous embodiments of the present invention are delineated herein.

According to a first aspect of the present invention, a method is provided for sealing an opening in a substrate. The method includes the following steps: First of all, a substrate having a cavity is provided, the cavity being accessible through the opening. In addition, a fluid of a specific composition and under a specific pressure is introduced into the cavity. A sealing material is further provided that is applied on the opening and thus encloses the fluid in the cavity, in so doing, sealing material being prevented from penetrating into the cavity. The method of the present invention has the advantage of enclosing a fluid of a specific well-defined composition and under a specific well-defined pressure in the cavity. In so doing, pressure and composition of the fluid are decoupled from the provision and the application of the sealing material on the opening. Disadvantageous ambient conditions while providing and applying the sealing material therefore do not or do not significantly influence the fluid, which is enclosed in the cavity. Thus, neither sealing material nor other—and sometimes harmful—components which are obtained upon providing and applying the sealing material penetrate into the cavity, and damage to the cavity or any structures contained in it is avoided.

According to one specific embodiment of the present invention, the sealing material is provided by the providing of components. The specified components form the sealing material at the location of the opening by physical and/or chemical transformation, and in so doing, the opening is closed so that neither sealing material nor components penetrate into the cavity. In advantageous manner, a well-defined fluid is thereby enclosed in the cavity, neither sealing material nor components nor other reaction components being able to lead to damage in the cavity.

According to a further specific embodiment of the present invention, the sealing material is formed by a plasma-enhanced chemical vapor deposition process under an atmospheric pressure (PECVD). In a chemical vapor deposition process, the sealing material is initially brought in the form of components to the location of the deposition, in order to form the sealing material in the same place by a chemical and/or physical transformation. In so doing, penetration of components, reaction products or sealing material itself into the cavity often results in damage to structures provided there. However, carrying out the chemical vapor deposition according to the present invention at atmospheric pressure advantageously prevents the diffusion of harmful substances through the opening into the cavity. Moreover, the atmospheric pressure essentially in the range around 1 bar, which is elevated compared to conventional deposition methods, results in an advantageous influencing of mechanical structures in the cavity. Thus, two advantages may be attained by one measure using the method of the present invention.

According to a further specific embodiment of the present invention, the sealing material is provided in the form of a paste. Further, in this context, the sealing material may be introduced in a carrier medium, which may be dissolved again after the application. By dissolving the carrier medium, the sealing material remains in a porous form, and the cavity is advantageously still accessible through the opening. Thus, further process steps may be carried out which require access to the cavity.

According to another specific embodiment of the present invention, the sealing material is applied in liquid form on the opening, so that the cavity is sealed off by solidification of the sealing material on the opening. In this context, advantageously, many customary sealing materials may be liquefied under almost any ambient conditions. The enclosure of a well-defined fluid of specific composition under a specific pressure in the cavity thereby becomes possible.

According to another specific embodiment of the present invention, a wetting film is formed on the substrate, at least in an area surrounding the opening. The wetting film according to the present invention advantageously promotes the accumulation of sealing material around and on the opening. For this purpose, a metallic eye may be provided as wetting surface for a solder around the opening.

According to a further exemplary embodiment of the present invention, the pressure of the enclosed fluid is between 500 mbar and 2 bar. On one hand, this pressure according to the exemplary embodiments and/or exemplary methods of the present invention prevents the diffusion of harmful substances into the cavity, and on the other hand, can favorably influence the structural properties of the cavity and mechanical properties of structures located in it. Furthermore, the temperature during the application of the sealing material may be between 175° C. and 400° C. In this case, advantageously a reliable application of the sealing material, e.g., by liquefaction, is ensured, while the temperature is not sufficient to damage components in and on the substrate.

According to another exemplary embodiment of the present invention, an anti-stiction coating is applied on an inner wall of the cavity and on a surface of the mechanical structure. This anti-stiction coating prevents adhesion of the mechanical structure, even in the event of mechanical contact with a surface of the cavity. Since adhesion of the mechanical structure to surfaces of the cavity represents a frequent cause for unstable operation of the integrated component or even for its complete failure, the provision of the anti-stiction coating according to the exemplary embodiments and/or exemplary methods of the present invention leads to a substantial improvement in the operation and reliability of the integrated component.

According to a second aspect of the exemplary embodiments and/or exemplary methods of the present invention, an integrated component is provided. The integrated component has a substrate having a cavity, the latter surrounding a mechanical structure. Furthermore, the cavity is filled with a fluid of a specific composition and under a specific pressure. The mechanical properties of the mechanical structure are able to be influenced considerably by the fluid. The integrated component of the exemplary embodiments and/or exemplary methods of the present invention permits a considerable influencing of the mechanical properties of the mechanical structure. Advantageously, a purposive adjustment of mechanical parameters is thus possible, like, for instance, the adjustment of the damping. At the same time, the integrated component is sealed off in reliable and stable fashion. Moreover, the production of the integrated component according to the exemplary embodiments and/or exemplary methods of the present invention is simplified substantially by a well-defined fluid of specific composition and under a specific pressure, since harmful substances are prevented from penetrating into the cavity during production. Consequently, the performance and reliability of integrated components having mechanical structures may be improved considerably.

DETAILED DESCRIPTION

Figure 1A:
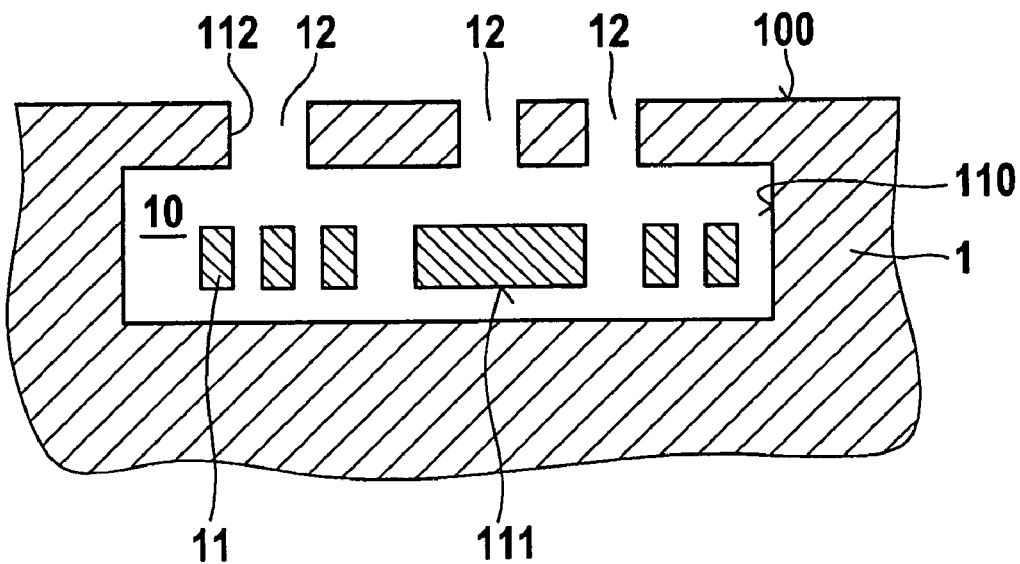
FIGS. 1A, 1B, 1C and 1D show a schematic sectional view of an integrated component according to a first specific embodiment of the present invention.
Figure 1B:
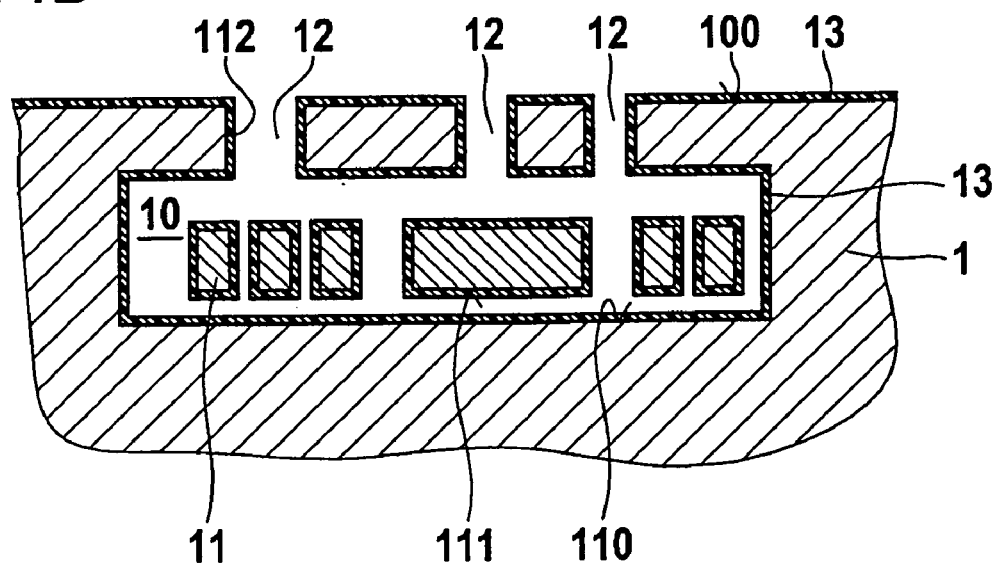

FIG. 1A shows an integrated component in a substrate 1 having a mechanical structure 11 which is disposed in a cavity 10. A substrate surface 100 features openings 12 having inner walls 112. The inner surface of cavity 10 is denoted by reference numeral 110, and the surface of mechanical structure 11 is denoted by reference numeral 111. An integrated component of this kind is produced with the aid of a number of process techniques known per se. Substrate 1 often features silicon, silicon oxide, silicon nitride and other customary materials in the form of patterned layers. So, for example, mechanical structure 11 is exposed by the removal of a silicon-oxide layer situated below it. Openings 12 in substrate surface 100 are also used for feeding liquids and gases, subject to the process. So that the functioning of the integrated component is not impaired even upon mechanical contact of mechanical structure 11 with the walls of cavity 10, an anti-stiction coating (ASC) 13 is applied on a surface 111 of mechanical structure 11, on an inner wall 110 of cavity 10, on an inner wall 112 of openings 12 and on substrate surface 100, as shown in FIG. 1B. This anti-stiction coating increases the reliability of the integrated component considerably. However, the provision of an anti-stiction coating 13 is not requisite for this specific embodiment.

Figure 1C:
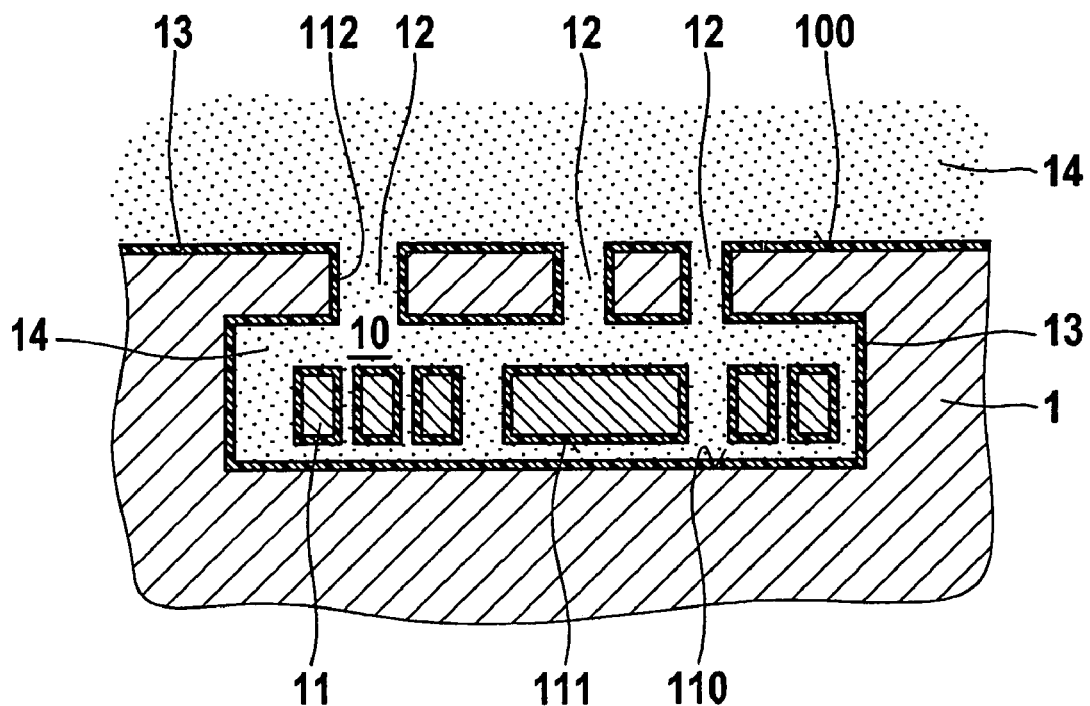

In a further step as shown in FIG. 1C, a fluid 14 is introduced through openings 12 into cavity 10. Within the meaning of the exemplary embodiments and/or exemplary methods of the present invention, a fluid denotes both gases and liquids, which are also able to interact advantageously with mechanical system 11. Thus, for example, the pressure and the composition of fluid 14 may be selected in such a way that a specific mechanical damping of mechanical structure 11 is attained. Modern deposition techniques such as chemical vapor deposition (CVD) first of all bring components to the location of the deposition, at which the material to be deposited then forms by chemical and/or physical transformation. In so doing, starting components, materials used or reaction products can damage mechanical structure 11, cavity 10 or even coatings like, for instance, anti-stiction coating 13. In this case, fluid 14 also prevents the penetration of such harmful components and substances.

Figure 1D:
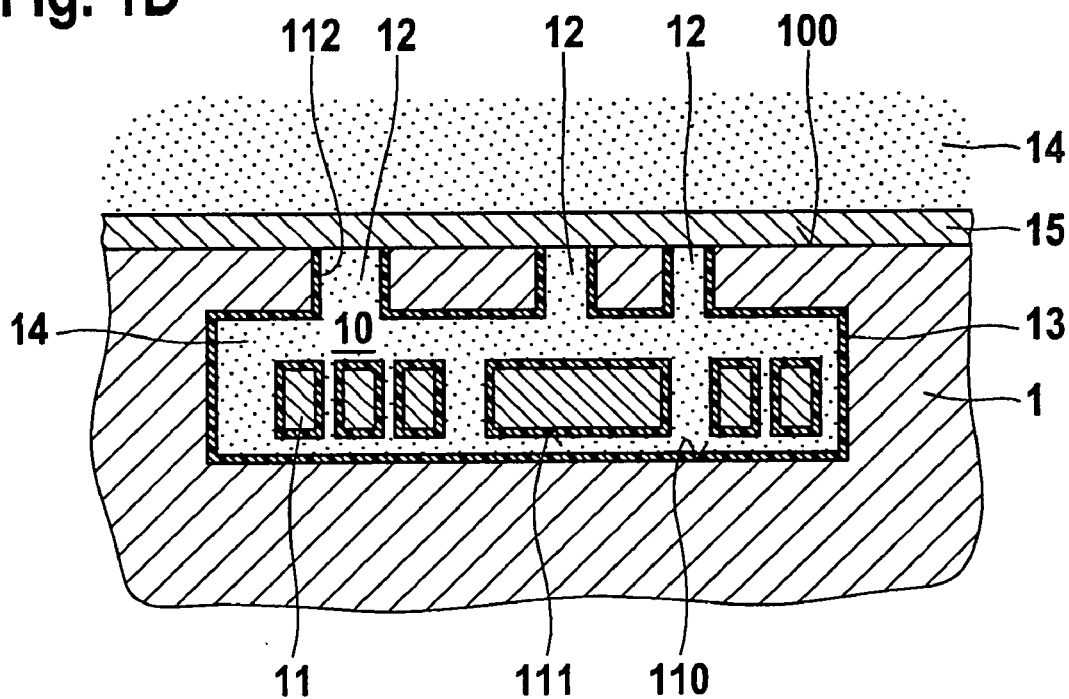

Finally, FIG. 1D shows the integrated component having a sealing layer 15 which seals off openings 12, and encloses fluid 14 at a specific pressure and with a specific composition in cavity 10. At the same time, the process of applying sealing layer 15 can remove anti-stiction coating 13 on substrate surface 100. The pressure of fluid 14, which may be in the range around 1 bar, is able both to prevent the penetration of harmful substances, and at the same time to influence the mechanical properties of mechanical structure 11. It has turned out that an integrated component as shown in FIG. 1D is able to be sealed off by a plasma-enhanced chemical vapor deposition process (PECVD) at a pressure which corresponds essentially to the atmospheric pressure of 1 bar, without sealing material or harmful substances damaging mechanical structure 11, anti-stiction coating 13 or other components in cavity 10. A low-frequency plasma frequency in the range of 10 Hz to 200 kHz may be used in the PECVD process.

Figure 2A:
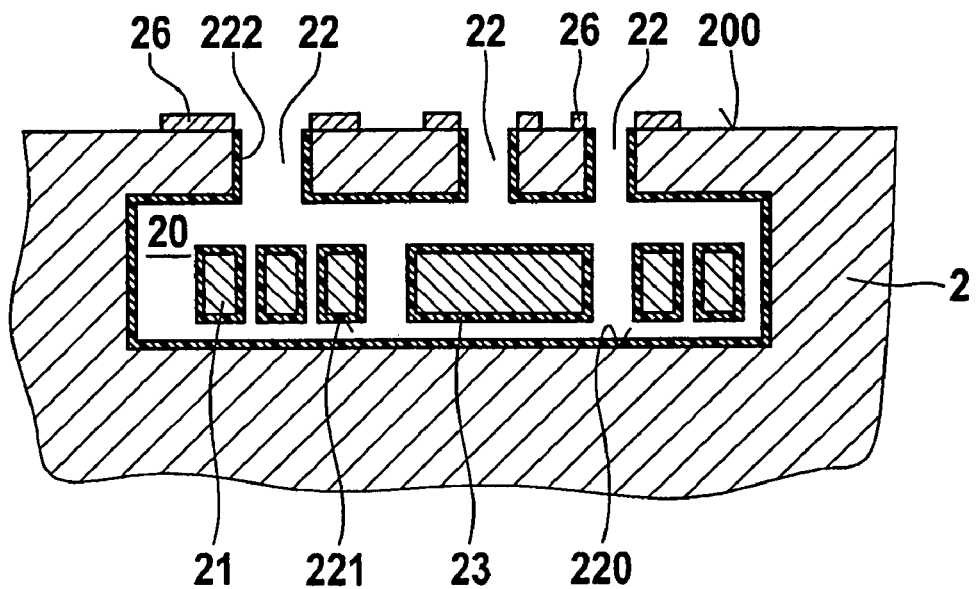
FIGS. 2A, 2B, 2C and 2D show a schematic sectional view of an integrated component according to a second specific embodiment of the present invention.

FIG. 2A shows a further integrated component having a substrate 2 with a cavity 20, in which a mechanical structure 21 is provided. A surface 220 of cavity 20 and a surface 221 of mechanical system 21 are coated with an anti-stiction coating 23. Cavity 20 is accessible via openings 22 having inner walls 222. A wetting film 26 has been applied in parts on a surface 200 of substrate 2, at least in an area surrounding openings 22. An advantageous surrounding area of an opening 22 is formed by a ring-shaped region encircling opening 22, the breadth of the ring being between one and tenfold of the opening diameter. In accordance with the exemplary embodiments and/or exemplary methods of the present invention, the surrounding area may maintain a minimum distance to the edge of opening 22, reach directly up to opening 22, or perhaps also encompass opening 22.

In accordance with one advantageous specific embodiment, a conductive sealing material is selected, e.g., what are referred to as solder bumps, which in addition to the sealing of openings 22, also provides an electrical contact to a further substrate disposed above substrate 2. The further substrate may then also include an electrical driving circuit. In accordance with a further advantageous specific embodiment, the integrated component is coated in such a way with anti-stiction coating 23 that the material of anti-stiction coating 23 develops on surface 200, as well. This material may then be removed locally in the area surrounding openings 22, and allow no further coatings at coated locations. For example, the material of anti-stiction coating 23 then acts on surface 200 as a soldering-stopping lacquer.

Figure 2B:
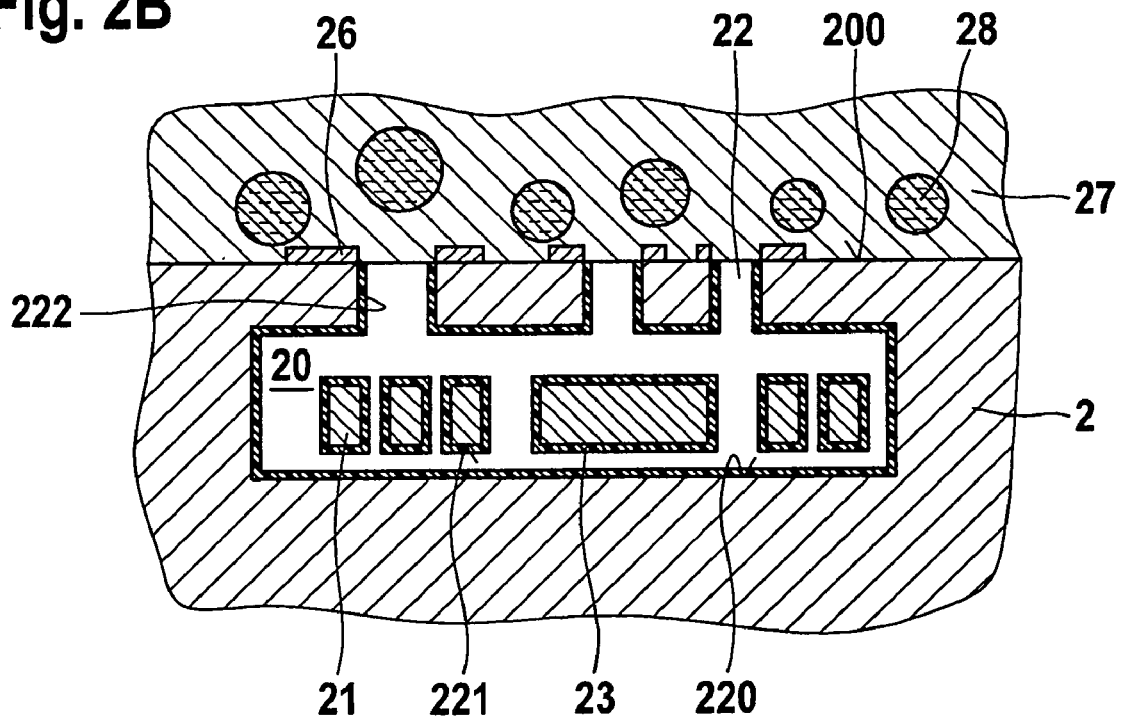
Figure 2C:
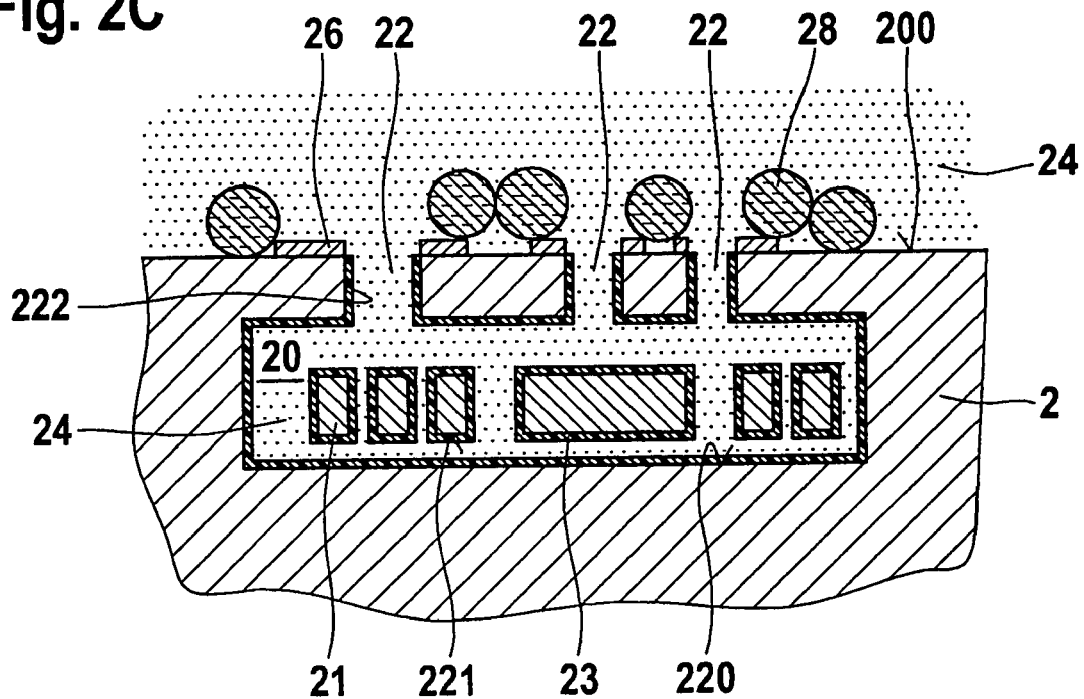

In one manufacturing step, a sealing material 28 in the form of a paste is applied on surface 200 of substrate 2, as shown in FIG. 2B. In this case, sealing material 28 may be provided in a granulated form and the paste may form in a carrier medium 27. Examples for this are soldering pastes or sintered-glass pastes, in which granulated metal or a granulated sealing glass is in a binder. Carrier medium 27 is not imperative in accordance with the exemplary embodiments and/or exemplary methods of the present invention, however it simplifies the application of sealing material 28. If a carrier medium 27 is provided, it is removed in a following manufacturing step as shown in FIG. 2C. For example, an organic carrier medium 27 may be burned off. A porous configuration of sealing material 28 remains on surface 200. Therefore, openings 22 are still permeable, and cavity 20 is accessible even after the application of sealing material 28. Thus, further process steps, such as the application of anti-stiction coating 23, may be carried out in this state, as well.

Figure 2D:
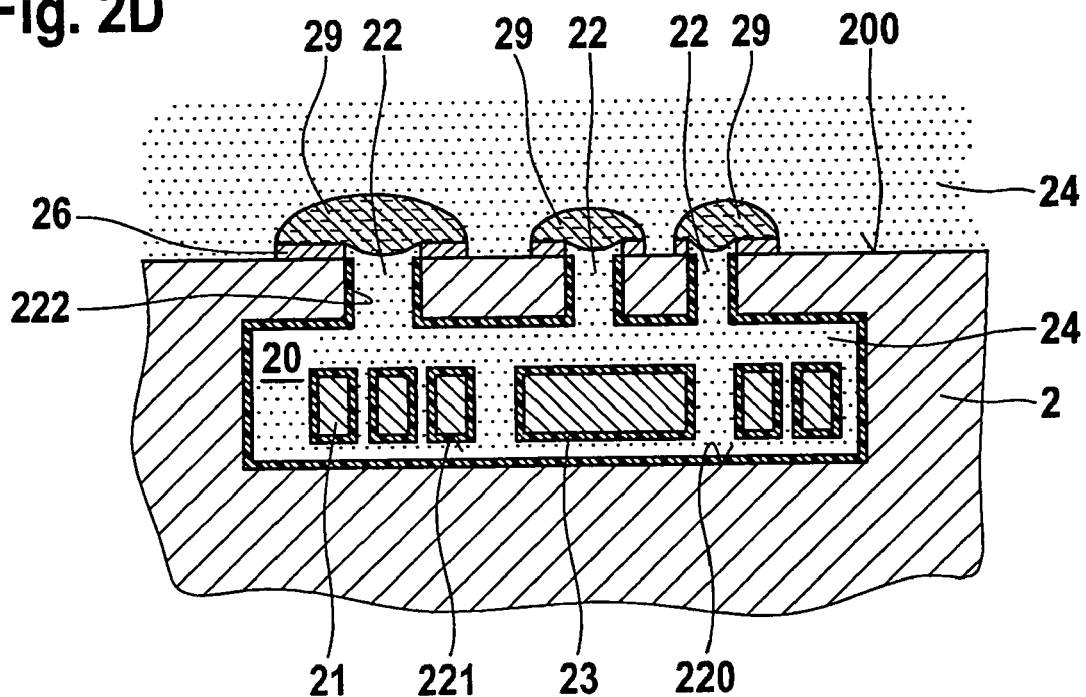

As further shown in FIG. 2C, a fluid 24 is introduced into cavity 20 of substrate 2. Both the composition and the pressure of fluid 24 are selected in such a way that fluid 24 enclosed in cavity 20 does not damage mechanical structure 21 or its coating and advantageously adjusts the mechanical properties of mechanical system 21 in the desired manner. In addition, fluid 24 is able to prevent diffusion of harmful substances into cavity 20. The sealing material is liquefied by planar or local heating, and thereupon may be gathered at the locations of wetting film 26 and form a cap over openings 22. Solidified sealing material 28 therefore forms impervious sealing caps 29 as shown in FIG. 2D. The melting of sealing material 28 permits independence to the greatest extent possible with respect to the pressure and composition of fluid 24. It is therefore possible to enclose a desired fluid 24 or perhaps a vacuum in leak-proof fashion in cavity 20. It is further possible to dispense with the application of sealing material 28 and carrier medium 27, and merely to provide a liquid sealing material that advantageously remains adherent on wetting film 26, as may be accomplished, for example, by wave soldering or a solder bath. Advantageously, the liquefied sealing material should exhibit a surface tension which, on one hand, promotes the formation of a cap over openings 22, and on the other hand, suppresses a penetration into the openings. It is thus possible to dispense with wetting film 26.

Figure 3A:
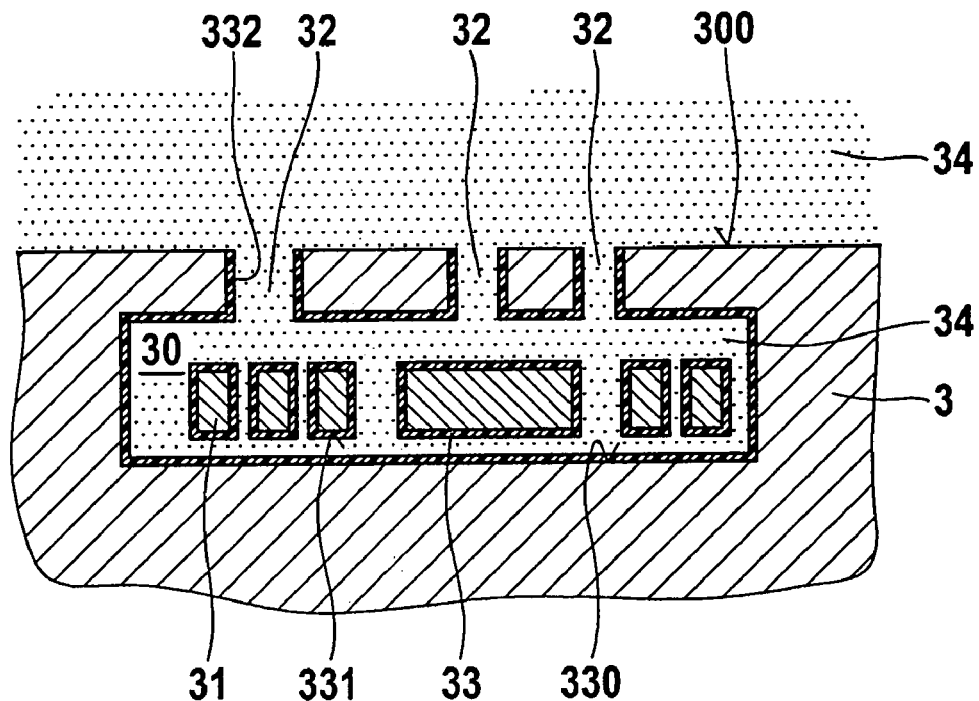
FIGS. 3A and 3B show a schematic sectional view of an integrated component according to a third specific embodiment of the present invention.

FIG. 3A shows a further integrated component in a substrate 3 having a mechanical structure 31 which is disposed in a cavity 30. Cavity 30 is accessible via openings 32 having inner walls 332. Both a surface 330 of cavity 30 and a surface 331 of mechanical structure 31 are coated with an anti-stiction coating 33. In addition, a fluid 34 is introduced into cavity 30.

Figure 3B:
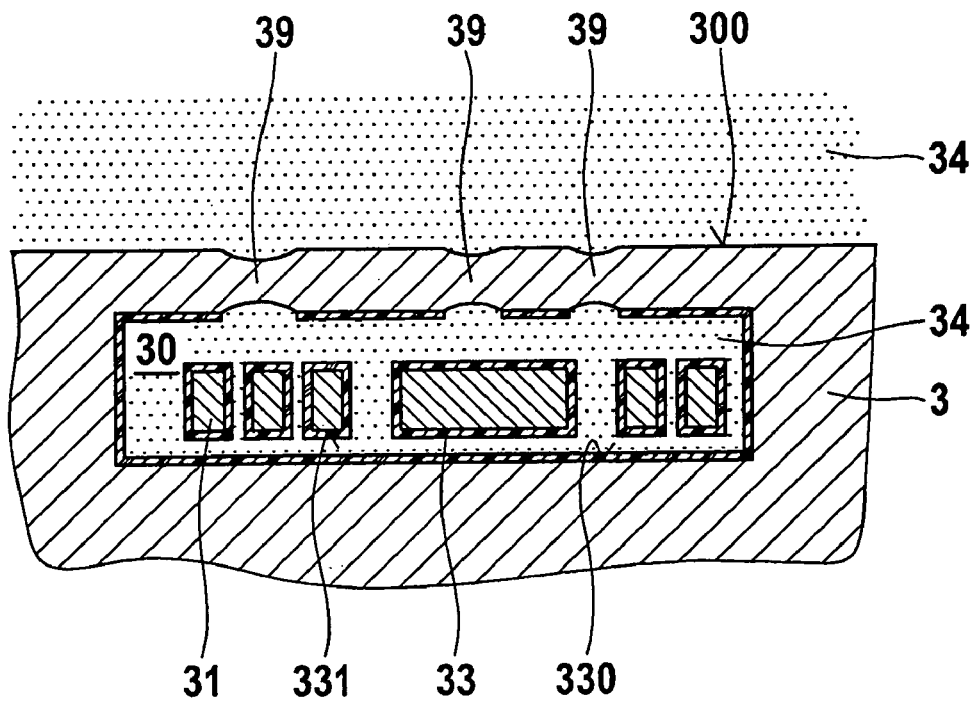

By local melting, like, for example, by a laser beam, a previously applied sealing material or an upper part of substrate 3 is liquefied and seals off openings 32 by stoppers 39, as shown in FIG. 3B. In this specific embodiment, the sealing material may be formed by substrate 3. Therefore, a well-defined fluid 34 may be introduced under a specific pressure and with a specific composition into cavity 30, without necessitating additional process steps for applying further sealing materials. Another advantage is that the previously patterned integrated component may be gently processed. This method also allows a selective closure of openings 32 in that, for example, initially a first portion of openings 32 is closed, further process steps are thereupon carried out which still require an access to cavity 30, and after that, remaining openings 32 are sealed. In addition to the melting of parts of substrate 3, by local heating, it is also possible to use a separate material to form stoppers 39, such as metals which are deposited in an area around openings 32 prior to the melting process. Alternatively, material in the form of a foil (or film), e.g., made of metal, a thermoplastic or thermosetting plastic may also be provided.

In all the specific embodiments, the temperature during the application and the melting of the sealing material may be in a range of 175° C. to 400° C. Furthermore, $SiO_2$ or $Si_3N_4$, for example, may be used as sealing material, and nitrogen, neon, mixtures thereof, $SF_6$, or other inert gases or mixtures thereof may be enclosed as fluid, for instance. Moreover, openings 12, 22, 32 may be of different sizes.

What is claimed is:

1. A method for sealing an opening in a substrate, the method comprising:
   providing a substrate having a cavity, the cavity being accessible through the opening;
   introducing a fluid of at least one of a specific composition and under a specific pressure into the cavity;
   providing a sealing material;
   applying the sealing material on the opening so that the fluid is enclosed in the cavity, so as to prevent the sealing material from penetrating into the cavity; and
   prior to applying the sealing material on the opening, applying an anti-stiction coating on an inner wall of the cavity and on a surface of a mechanical structure.

2. The method of claim 1, wherein the sealing material is provided by making components available which form the sealing material by at least one of physical transformation and chemical transformation, and wherein the sealing material is formed on the opening so that no components penetrate into the cavity.

3. The method of claim 2, wherein the components are provided and the sealing material is formed by a plasma-enhanced chemical vapor deposition process under an atmospheric pressure.

4. The method of claim 1, wherein the sealing material is provided as paste with a carrier medium that is dissolved after an application.

5. The method of claim 1, wherein the sealing material is applied in liquid form on the opening, so that the cavity is sealed off by solidification of the sealing material on the opening.

6. The method of claim 1, further comprising:
   forming a wetting film on the substrate at least in an area surrounding the opening.

7. The method of claim 1, wherein the pressure of the fluid is between 500 mbar and 2 bar.

8. The method of claim 1, wherein the temperature during the application of the sealing material on the opening is between 175° C. and 400° C.

9. An integrated component, comprising:
   a substrate having an opening and a cavity, wherein the cavity is accessible through the opening;
   wherein the opening is sealed off by the sealing material by (i) introducing a fluid of at least one of a specific composition and under a specific pressure into the cavity, (ii)

prior to applying the sealing material on the opening, applying an anti-stiction coating on an inner wall of the cavity and on a surface of a mechanical structure, and (iii) applying the sealing material on the opening so that the fluid is enclosed in the cavity, so as to prevent the sealing material from penetrating into the cavity.

10. A method for sealing an opening in a substrate, the method comprising:
    providing a substrate having a cavity, the cavity being accessible through the opening;
    introducing a fluid of at least one of a specific composition and under a specific pressure into the cavity;
    providing a sealing material as paste with a carrier medium that is dissolved after an application; and
    applying the sealing material on the opening so that the fluid is enclosed in the cavity, so as to prevent the sealing material from penetrating into the cavity.

11. The method of claim 10, wherein the sealing material is provided by making components available which form the sealing material by at least one of physical transformation and chemical transformation, and wherein the sealing material is formed on the opening so that no components penetrate into the cavity.

12. The method of claim 11, wherein the components are provided and the sealing material is formed by a plasma-enhanced chemical vapor deposition process under an atmospheric pressure.

13. The method of claim 10, further comprising:
    forming a wetting film on the substrate at least in an area surrounding the opening.

14. The method of claim 10, wherein the pressure of the fluid is between 500 mbar and 2 bar.

15. The method of claim 10, wherein the temperature during the application of the sealing material on the opening is between 175° C. and 400° C.

16. An integrated component, comprising:
    a substrate having an opening and a cavity, wherein the cavity is accessible through the opening;
    wherein the opening is sealed off by the sealing material by (i) introducing a fluid of at least one of a specific composition and under a specific pressure into the cavity, and (ii) applying the sealing material on the opening so that the fluid is enclosed in the cavity, so as to prevent the sealing material from penetrating into the cavity;
    wherein the sealing material is provided as paste with a carrier medium that is dissolved after an application.

* * * * *